United States Patent
Nishimura

(10) Patent No.: US 7,602,091 B2
(45) Date of Patent: Oct. 13, 2009

(54) POSITIONING APPARATUS AND EXPOSURE APPARATUS

(75) Inventor: Mitsuo Nishimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 836 days.

(21) Appl. No.: 11/060,302

(22) Filed: Feb. 18, 2005

(65) Prior Publication Data
US 2005/0186064 A1  Aug. 25, 2005

(30) Foreign Application Priority Data
Feb. 25, 2004 (JP) ............................. 2004-049938

(51) Int. Cl.
*H02K 7/09* (2006.01)
(52) U.S. Cl. ....................... 310/90.5; 310/12
(58) Field of Classification Search ............... 310/90.5, 310/12–15
See application file for complete search history.

(56) References Cited

U.S. PATENT DOCUMENTS

| | | | |
|---|---|---|---|
| 5,014,826 A | 5/1991 | Nakai et al. | 187/112 |
| 5,033,588 A | 7/1991 | Nakai et al. | 187/95 |
| 5,524,502 A | 6/1996 | Osanai | 74/490.07 |
| 5,760,564 A | 6/1998 | Novak | 318/687 |
| 6,359,677 B2 | 3/2002 | Itoh et al. | 355/53 |
| 6,606,146 B2 | 8/2003 | Saiki | 355/72 |
| 6,635,887 B2 | 10/2003 | Kwan et al. | 250/491.1 |
| 6,707,187 B1 * | 3/2004 | Gabrys | 310/74 |
| 6,852,989 B2 | 2/2005 | Kwan et al. | 250/491.1 |
| 6,946,757 B2 * | 9/2005 | Korenaga | 310/12 |
| 7,084,538 B2 * | 8/2006 | Takashima | 310/90.5 |
| 2004/0112164 A1 | 6/2004 | Asano et al. | 74/490.09 |

FOREIGN PATENT DOCUMENTS

| | | |
|---|---|---|
| JP | 60-50921 | 3/1985 |
| JP | 1-190524 | 7/1989 |
| JP | 2-241352 | 9/1990 |
| JP | 2-241353 | 9/1990 |
| JP | 5-57550 | 3/1993 |
| JP | 6-267823 | 9/1994 |
| JP | 6-320367 | 11/1994 |
| JP | 8-90378 | 4/1996 |
| JP | 9-34135 | 2/1997 |
| JP | 11-191585 | 7/1999 |
| JP | 2001-297960 | 10/2001 |
| JP | 2002-25902 | 1/2002 |

OTHER PUBLICATIONS

Japanese Office Action dated Feb. 24, 2006, issued in corresponding Japanese patent application No. 2004-049938, with English translation.
Japanese Office Action dated Oct. 6, 2006, issued in corresponding Japanese patent application No. 2004-049938.

* cited by examiner

*Primary Examiner*—Dang D Le
(74) *Attorney, Agent, or Firm*—Fitzpatrick, Cella, Harper & Scinto

(57) ABSTRACT

A positioning apparatus includes a beam which is driven in a first direction that is perpendicular to the longitudinal direction of the beam, a movable member which surrounds at least a part of the beam and moves with the beam moving in the first direction, an actuator which generates a force in the first direction between the beam and the movable member to control a positional relationship in the first direction between the beam and the movable member, and a position regulator arranged between the beam and the movable member and which regulates the positional relationship in the first direction between the beam and the movable member.

16 Claims, 15 Drawing Sheets

F I G. 7
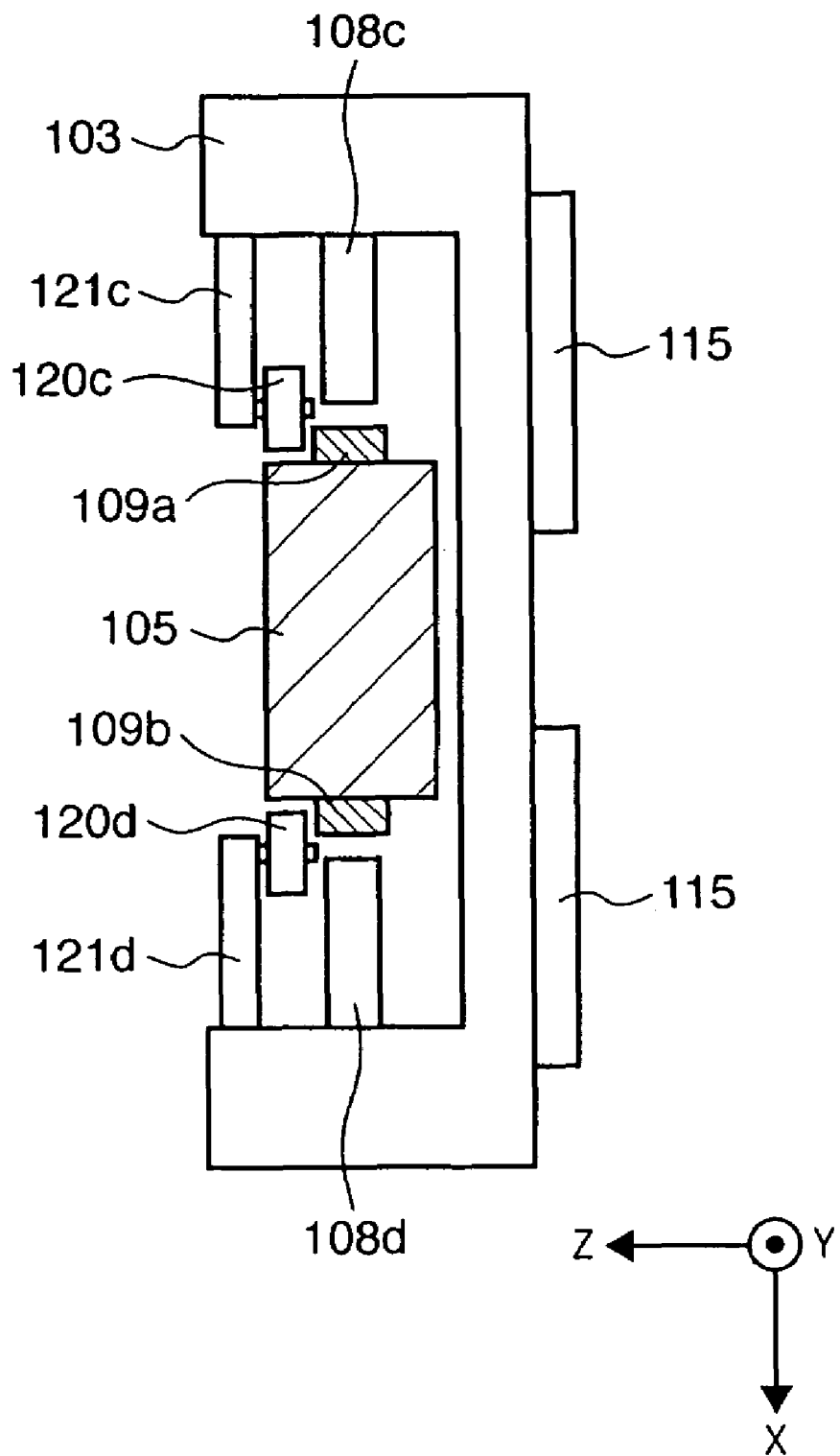

F I G. 12
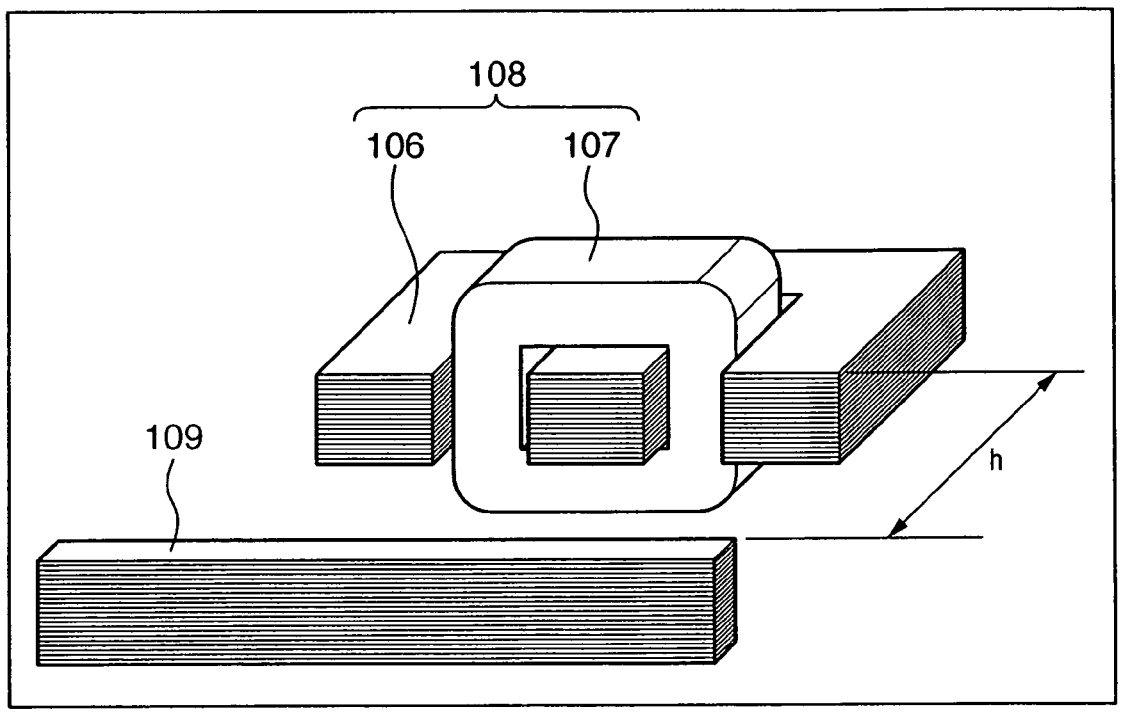

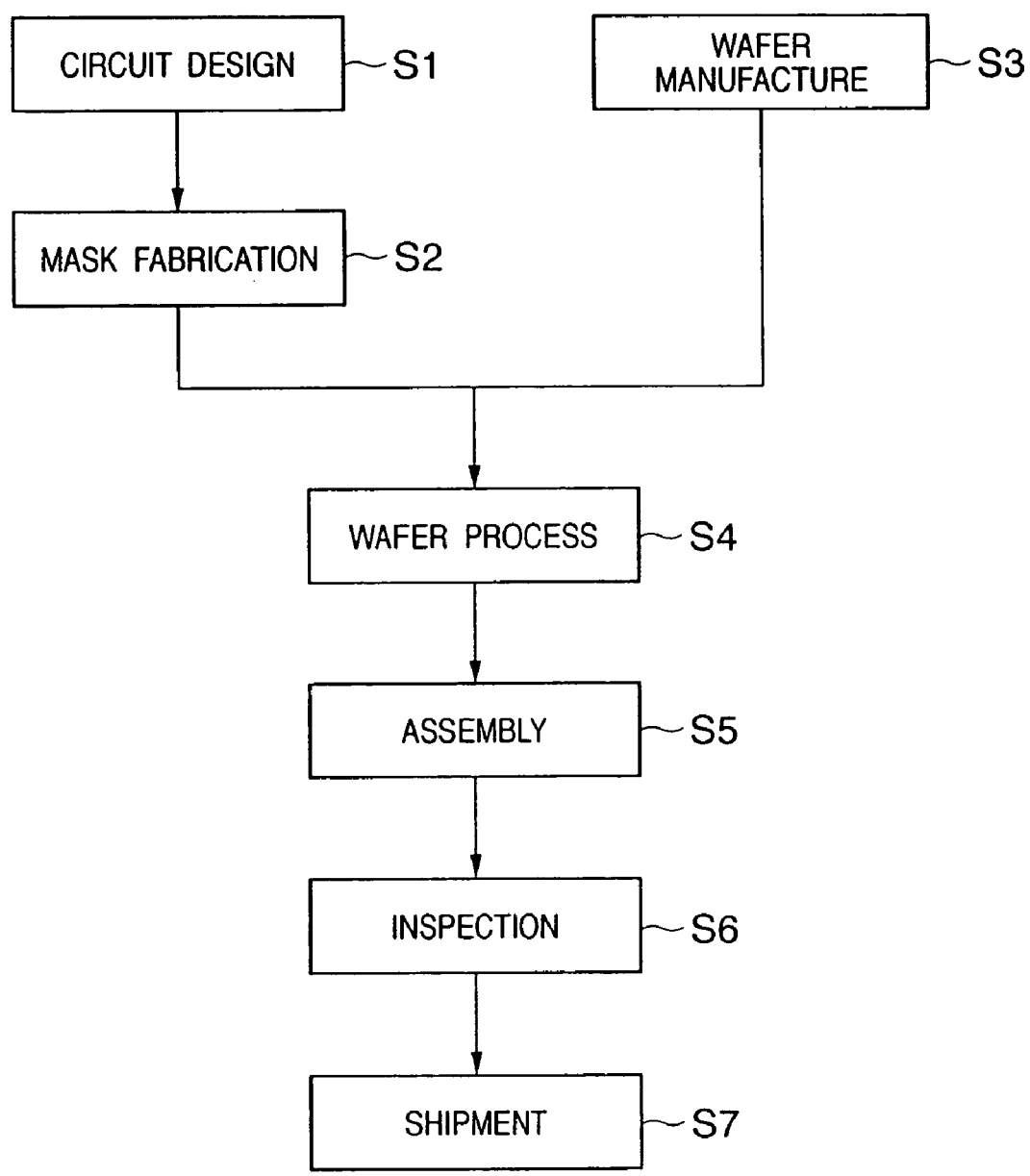
F I G. 14

POSITIONING APPARATUS AND EXPOSURE APPARATUS

This application claims priority from Japanese Patent Application No. 2004-049938, filed on Feb. 25, 2004, the entire contents of which are hereby incorporated by reference herein.

FIELD OF THE INVENTION

The present invention relates to a positioning apparatus and an exposure apparatus.

BACKGROUND OF THE INVENTION

In an exposure apparatus, an inspection apparatus, a machine tool, and the like, a positioning apparatus is used to position an object to be processed, or the like. FIG. 8 is a perspective view showing the schematic structure of a positioning apparatus formed as a wafer stage device for a semiconductor exposure apparatus. A wafer stage device 100 has a wafer chuck for holding a wafer (substrate). During exposure, the wafer is stepped to sequentially transfer a pattern onto the respective exposure regions on the wafer. The wafer stage device must have an accurate, high-speed positioning performance for forming a fine pattern and improving throughput.

To satisfy this demand, as shown in FIG. 9, the wafer stage device 100 is formed by combining a coarse movement portion 101 and a fine movement portion 102. The fine movement portion 102 is mounted on an X-Y slider 103. A hydrostatic guide (not shown) is arranged on the lower surface of the X-Y slider 103 to allow the X-Y slider 103 to move smoothly on a surface plate 104. An X beam 105 and a Y beam 150 extend through the X-Y slider 103 to transmit thrusts in X and Y directions to the X-Y slider 103. The X beam 105 and Y beam 150 are perpendicular to each other. The X beam 105 is hydrostatically guided by an X yaw guide 151 fixed to the surface plate 104. This regulates inclination of the X beam 105 in a yaw direction within an X-Y plane, so that the X beam 105 can move only in the X direction. The Y beam 150 is hydrostatically guided by a Y yaw guide 152 fixed to the surface plate 104 to be perpendicular to the X yaw guide 151. This regulates inclination of the Y beam 150 in the yaw direction within the X-Y plane, so that the Y beam 150 can move only in the Y direction.

The thrusts are supplied to the X beam 105 and Y beam 150 by X-movement linear motors 110a and 100b, arranged at the two ends of the X beam 105, and Y-movement linear motors 111a and 111b, arranged at the two ends of the Y beam 150, respectively. Each of the linear motors 110a, 110b, 111a, and 111b includes a movable element and a stator. Magnets, serving as the movable elements, are fixed to the two ends of each of the beams 105 and 150. When the movable elements are moved, the corresponding beams can be moved.

The positional relationship among the X beam 105, Y beam 150, and X-Y slider 103 will be explained by way of the positional relationship between the X beam 105 and X-Y slider 103.

FIGS. 10 and 11 are a (partially cutaway) plan view and side view showing the structure of the X beam 105 and X-Y slider 103. FIG. 12 is a perspective view of a coil unit 108 (to be described later). As shown in FIG. 12, the coil unit 108, obtained by winding a coil 107 on a core 106 (to be referred to as an E core hereinafter), is fixed to the X-Y slider 103. The E core 106 is obtained by stacking silicon steel plates, each having an E shape. In the example shown in FIG. 10, a total of four coil units 108a, 108b, 108c, and 108d are fixed to the X-Y slider such that two units on either side of the X beam 105 sandwich it.

Rectangular parallelepiped cores 109a and 109b (to be referred to as I cores hereinafter), each obtained by stacking silicon steel plates, are fixed to the two side surfaces of the X beam 105 within the movable range of the X-Y slider 103.

As shown in FIG. 12, a gap h is formed between the E core 106 and the corresponding I core 109. When a current is supplied to the coil 107, a magnetic circuit is formed between the E core 106 and I core 109 to generate an attracting force. The gap h can be changed by using the attracting force to control the positions of the X beam 105 and X-Y slider 103 relative to each other.

The pair of coil units 108a and 108b and the pair of coil units 108c and 108d are arranged on the two sides of the X beam 105, such that the lines of operation of the attracting forces substantially coincide with each other. Thus, the X-Y slider 103 can be moved in two directions, i.e., to the + and − sides in the X direction.

Gaps h1, h2, h3, and h4 (see FIG. 10) are detected by sensors (not shown). While controlling currents to be supplied to the coil units 108a, 108b, 108c, and 108d, on the basis of detection information obtained by the sensors, the X beam 105 is moved by the X-movement linear motors 110a and 110b. Thus, the X-Y slider 103 can be moved, while it is kept to not be in contact with the X beam 105.

This structure applies to the gap between the Y beam 150 and X-Y slider 103. When the X beam 105 and Y beam 150 are moved independently of each other, the X-Y slider 103 can be moved in the X and Y directions on the surface of the surface plate 104.

Usually, during operation, the X-Y slider 103 is moved while maintaining the X beam 105 and Y beam 150 to not be in contact with the X-Y slider 103. To move the X-Y slider 103 by driving the beams 105 and 150, while maintaining the gaps h between the I cores 109 on the X beam 105 side and Y beam 150 side and the E cores 106 on the X-Y slider 103 side, the currents to be supplied to the E cores 106 must be controlled highly accurately.

During operation before a stage, when a highly accurate control operation is performed, as in assembly, during a test operation in maintenance, or when unexpected disturbance occurs, sometimes, the non-contact state between an I core 109 on a beam side and an E core 106 on the X-Y slider 103 side cannot be maintained, and the I core 109 and E core 106 may undesirably come into contact with each other. When this contact occurs, it may form a hitting mark on a pertinent component or cause wear. Then, the gap h between the I core 109 and E core 106 may change locally, or the upper surface processed by plating, or the like, may be damaged, to cause the I core 109 or E core 106 to rust, eventually, impairing smooth movement of the X-Y slider 103. This interferes with accurate positioning. As fluctuations in gap h between the I core 109 and E core 106 can cause the X-Y slider 103 to rotate in a yaw direction ($\omega Z$ direction), the edge of the E core 106 may come into contact with the I core 109, to promote the damage. Furthermore, if the X-Y slider 103 moves with I core 109 and E core 106 being in contact with each other, the damage can become more apparent.

SUMMARY OF THE INVENTION

The present invention has been made in recognition of the above problems by the present inventor, and has as its object to prevent wear of or damage to the constituent components of the positioning apparatus.

A positioning apparatus according to the present invention comprises a beam, a movable member, which surrounds at last a part of the beam and moves with the beam, an actuator, which generates a force between the beam and the movable member, to control a positional relationship between the beam and the movable member, and a position regulator, which regulates the positional relationship between the beam and the movable member.

According to a preferred embodiment of the present invention, a minimum gap between the beam and the movable member can be determined by the position regulator.

According to a preferred embodiment of the present invention, the actuator can include a first element fixed to the beam and a second element fixed to the movable member, and the position regulator can be arranged so that the first and second elements do not come into contact with each other. Alternatively, the actuator can include an element fixed to the beam, and the position regulator can be arranged so that the element and the movable member do not come into contact with each other. Alternatively, the actuator can include an element fixed to the movable member, and the position regulator can be arranged so that the element and the beam do not come into contact with each other.

According to another preferred embodiment of the present invention, the actuator can be formed to control the positional relationship between the beam and the movable member by an electromagnetic force. Alternatively, the actuator can be formed to control the positional relationship between the beam and the movable member by a gas pressure.

According to still another preferred embodiment of the present invention, the position regulator can include a bearing. The bearing can have an outer ring, which can rotate about an axis perpendicular to a plane, on which the movable member can move along the beam. The bearing can be formed such that an impact to be applied to the bearing can be buffered by decreasing a gap between the beam and the movable member. The bearing has, e.g., a buffer member around an outer ring.

According to still another preferred embodiment of the present invention, the position regulator comes into contact with the beam or the movable member, when a gap between the beam and the movable member reaches a predetermined value, to be able to regulate the positional relationship between the beam and the movable member, such that the gap between the beam and the movable member does not decrease to be as small as less than the predetermined value.

According to still another preferred embodiment of the present invention, the position regulator can be arranged, between the beam and the movable member, at each of at least two positions on two sides of the actuator.

An exposure apparatus according to the present invention comprises the positioning apparatus described above as an apparatus for positioning a substrate.

According to the present invention, for example, wear of or damage to the constituent components of the positioning apparatus can be prevented.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a sectional view taken along the line X4-X4' of FIG. 6 and seen leftward;

FIG. 12 is a perspective view showing the structure of a coil unit in a linear motor;

FIG. 14 is a flowchart showing a semiconductor device manufacturing process using an exposure apparatus having a built-in positioning apparatus or a wafer stage device of the present invention, represented by the first to fourth embodiments.

DETAILED DESCRIPTION OF THE PREFERRED EMBODIMENTS

The preferred embodiments of the present invention will be described hereinafter. Matters that are not particularly referred to in the following description can follow the matters that have already been described with reference to FIGS. 8 to 12.

First Embodiment

Figure 1:
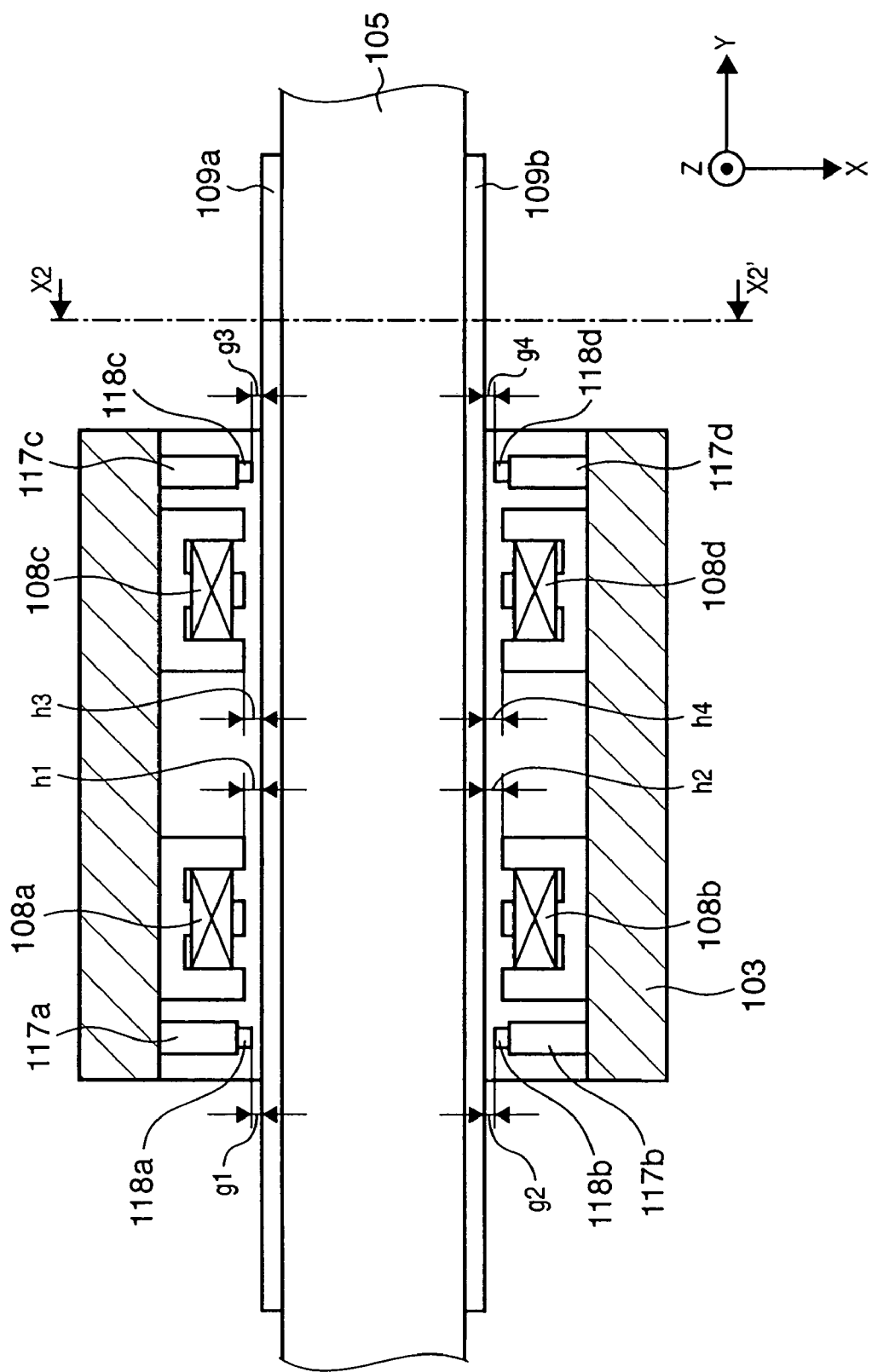
FIG. 1 is a (partially cutaway) plan view showing part of an X beam and an X-Y slider in a wafer stage device or a positioning apparatus (first embodiment)
Figure 2:
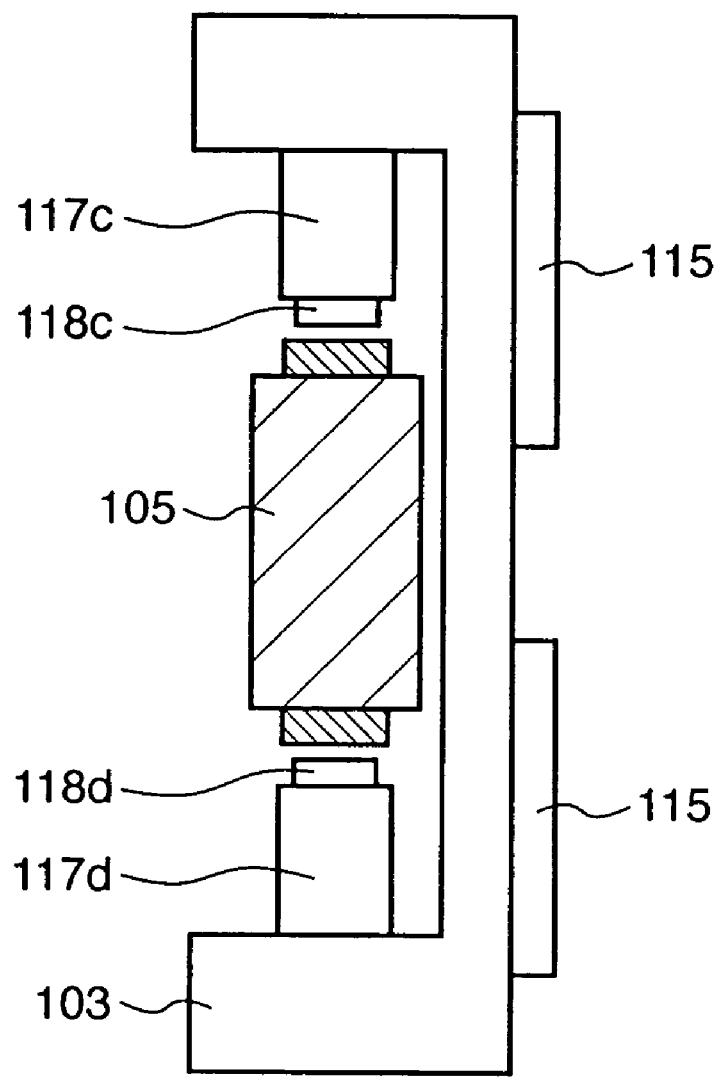
FIG. 2 is a sectional view taken along line X2-X2' of FIG. 1 and seen leftward.
Figure 8:
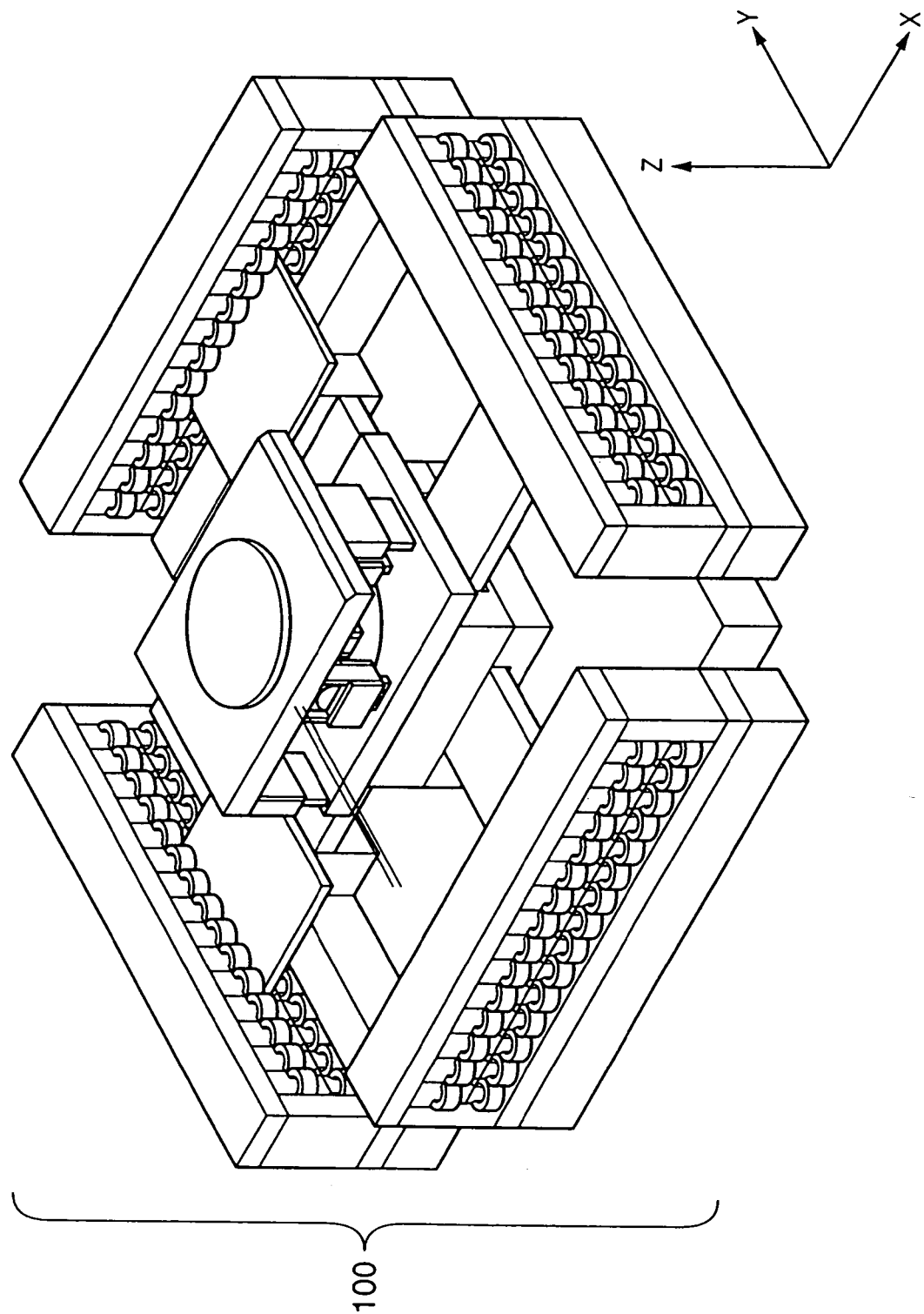
FIG. 8 is a perspective view showing the schematic structure of a positioning apparatus.
Figure 9:
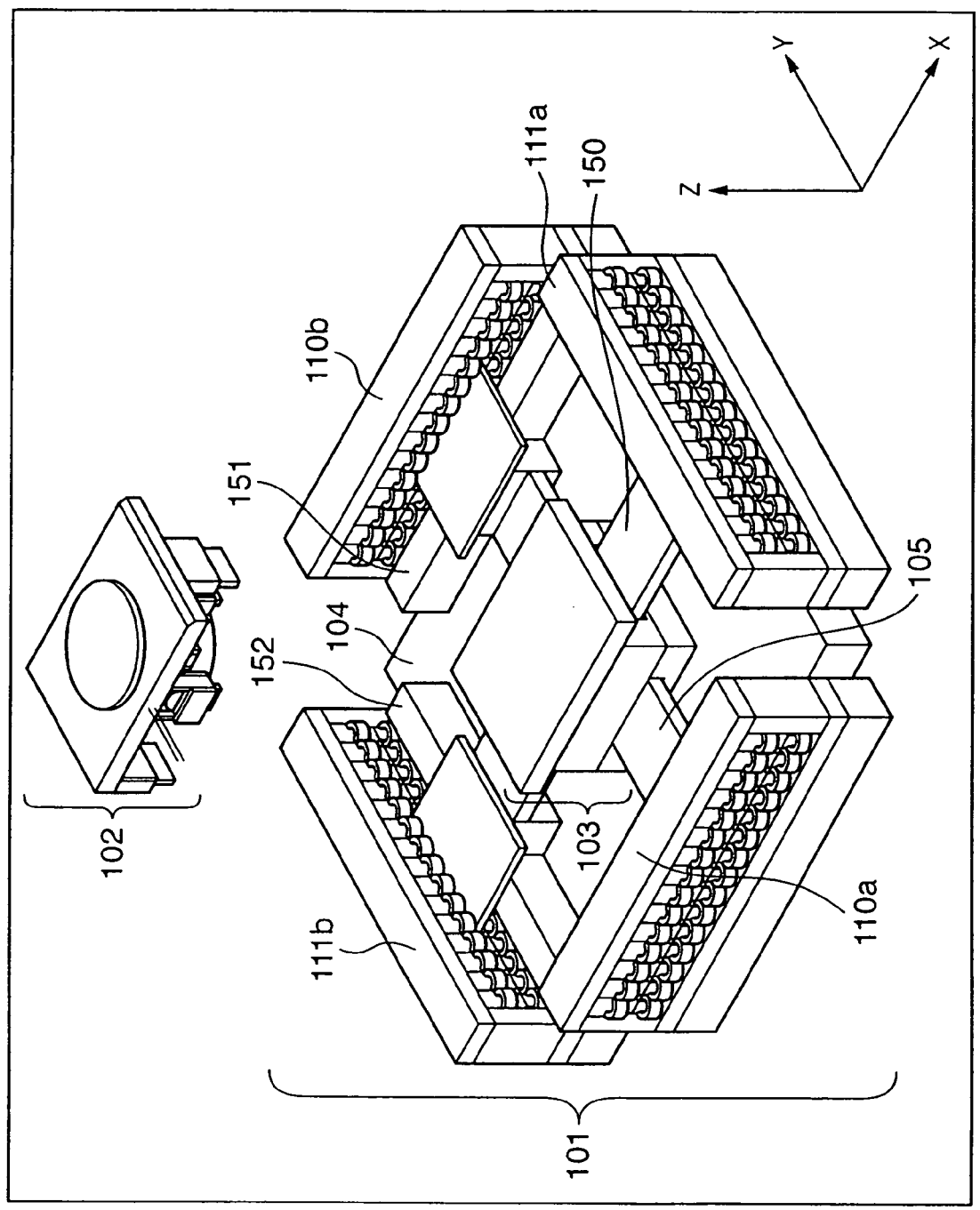
FIG. 9 is a partially exploded perspective view of the positioning apparatus.
Figure 10:
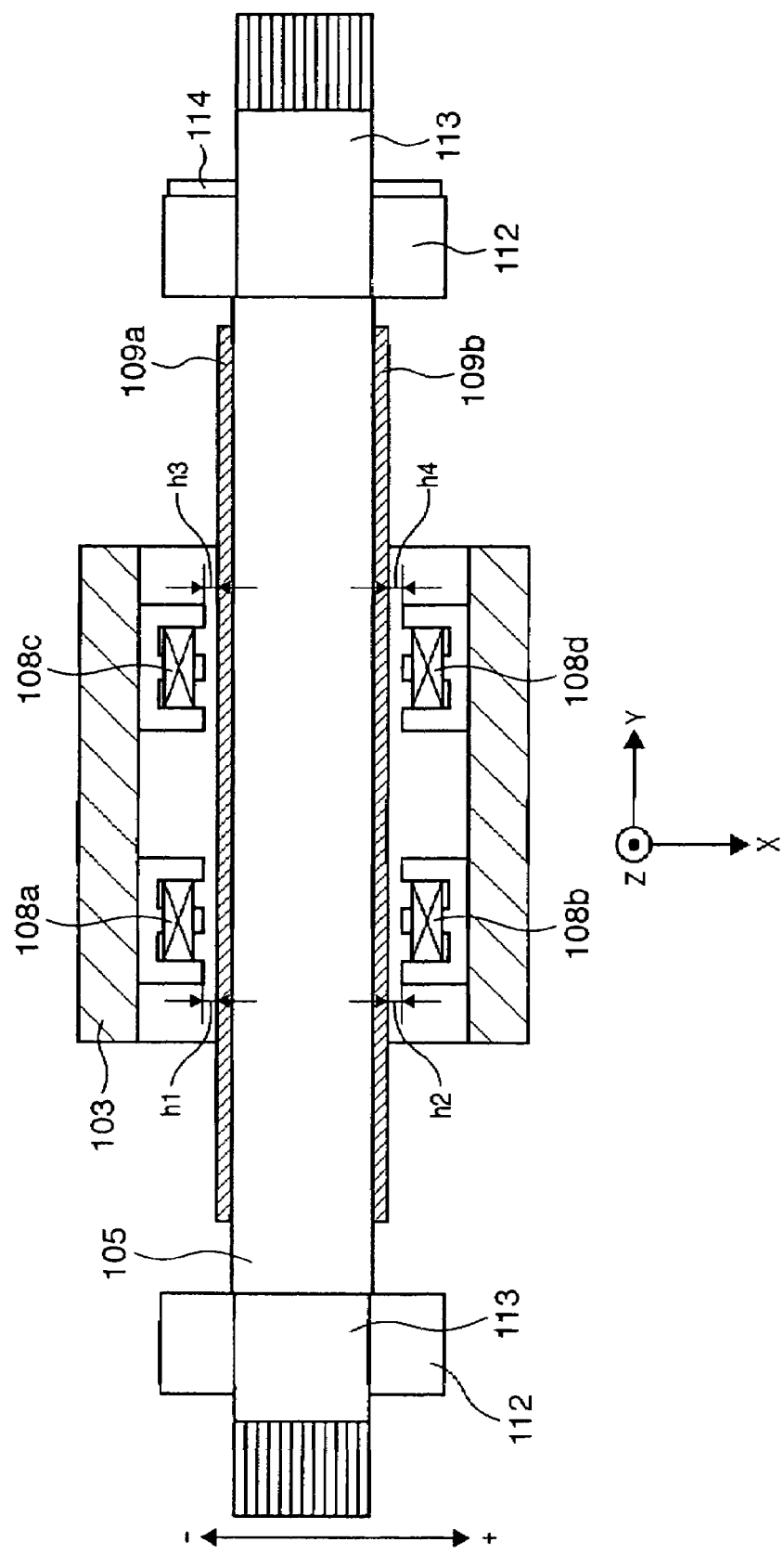
FIG. 10 is a (partially cutaway) plan view showing the conventional structure of an X beam and an X-Y slider.
Figure 11:
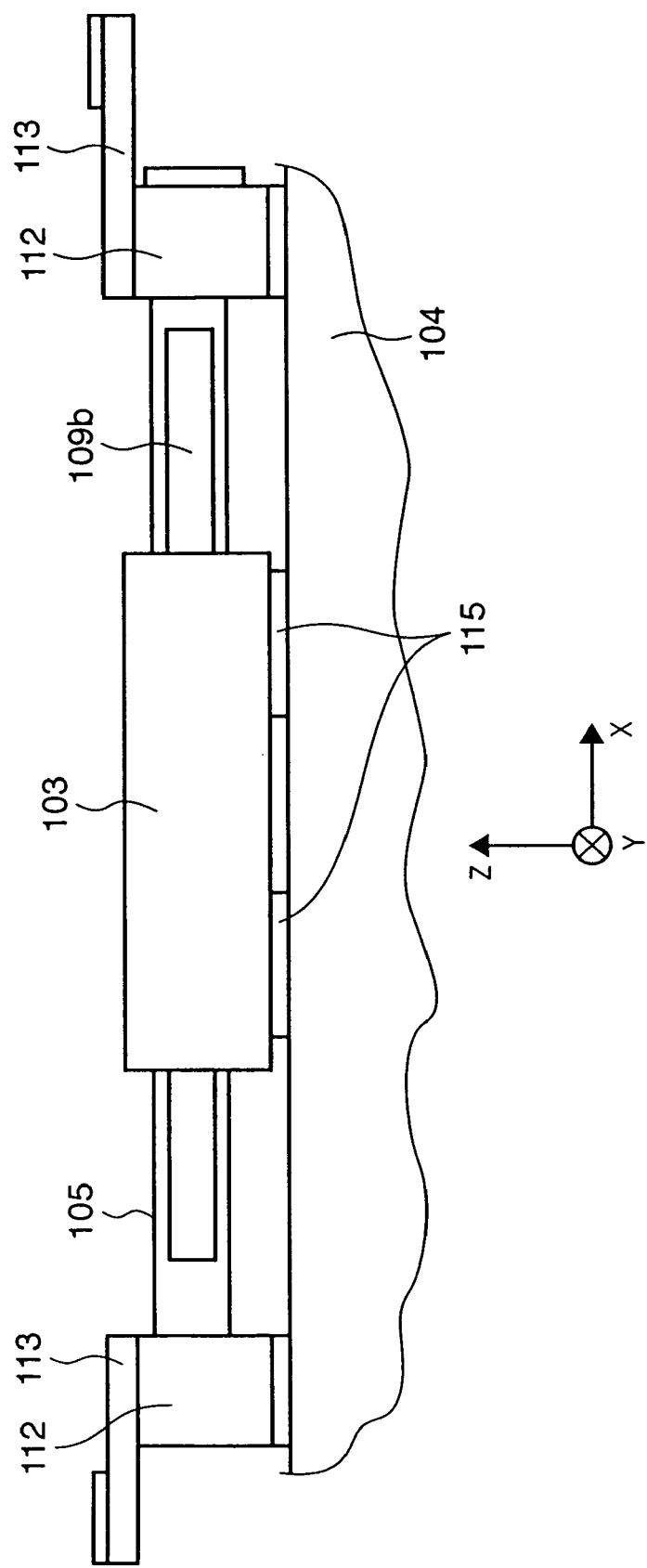
FIG. 11 is a side view showing the conventional structure of the X beam and the X-Y slider.

FIG. 1 is a (partially cutaway) plan view showing part of an X beam 105 and an X-Y slider 103 in a wafer stage device or a positioning apparatus, shown in FIGS. 8 and 9. FIG. 2 is a sectional view taken along the line X2-X2' of FIG. 1 and seen leftward.

The positioning apparatus has the beam 105, a movable element including the X-Y slider 103, which surrounds at least part of the beam 105 and moves together with the beam 105, an actuator including E cores 108a to 108d and I cores 109a and 109b, which generate a force between the beam 105 and the movable element, and regulate the positional relationship between the beam 105 and the movable element, and a position regulator, including stoppers 118a to 118d and pedestals 117a to 117d, which regulate the positional relationship between the beam 105 and the movable element. The minimum gap between the X beam 105 and the movable element is determined, not by the actuator, but by the position regulator. Hence, the position regulator prevents the beam 105 and the movable element from moving close to each other to cause wear or damage to the actuator.

In the example shown in FIG. 1, a total of four coil units 108a, 108b, 108c, and 108d, i.e., two coil units on one side and two other units on the other side of the X beam 105 to sandwich it, are fixed to the X-Y slider 103. As shown in FIG. 12, each of the coil units 108a, 108b, 108c, and 108d can be formed by winding a coil 107 around an E core 106 obtained by stacking silicon steel plates, each having an E shape.

The rectangular parallelepiped I cores 109a and 109b, each obtained by stacking silicon steel plates, are fixed to the two side surfaces of the X beam 105 within the movable range of the X-Y slider 103.

Gaps h1 to h4 between the E core end faces of the coil units 108a to 108d and the corresponding X beam 105-side I core end faces can be designed to, e.g., about several tens of μm. The distances between the upper surfaces (surfaces opposing the I cores) of the three comb fingers of the respective E cores and the E core attaching surfaces (surfaces where the E cores are to be attached) of the X-Y slider 103 are important in determining the gaps h1 to h4. When a plurality of E cores are present, preferably, all the upper surfaces of the comb fingers of the plurality of E cores arranged in a row are machined simultaneously to decrease errors among the upper surfaces of the comb fingers to several μm or less. Spacers may be interposed between the E core attaching surfaces and the E cores, and the spacer thicknesses may be adjusted. When four coil units are used, the electromagnetic attracting forces generated between the coil units and I cores can perform posture control in each of the X direction and a rotational direction within an X-Y plane.

The stoppers 118a to 118d are arranged beside the coil units 108a to 108d. The stoppers 118a to 118d are fixed to the X-Y slider 103 at, e.g., four portions, through the pedestals (support members) 117a to 117d. Distances g1 to g4 between the distal end faces (surfaces opposing the I cores) of the stoppers 118a to 118d and the I core end faces are designed to be smaller than the gaps h I to h4 between the coil units and I cores. Thus, when the gaps between the X beam 105 and the E cores on the X-Y slider 103 decrease, or the X-Y slider 103 is inclined in a yaw direction (ωZ direction) with respect to the beam 105, the stoppers come into contact with the I cores before the E cores of the coil units come into contact with the I cores. Thus, the E cores can be prevented from being damaged or worn.

At least the distal end portions (distal end faces) of the stoppers 118a to 118d are preferably made of a material having a small sliding resistance, so that the distal end portions can stand movement in the Y direction, while the stoppers 118a to 118d are in contact with the I cores 109a and 109b. At least the distal end portions (distal end faces) of the stoppers 118a to 118d are preferably made of a material having a good wear resistance, so that the stoppers 118a to 118d do not generate foreign substances by friction. Although FIG. 1 shows a structure having four coil units and four stoppers, the numbers of coil units and stoppers can be changed when necessary.

As described above, according to this embodiment, in a positioning apparatus in which electromagnetic attracting forces are exerted between the X-Y slider 103 and X beam 105 by the coil units and I cores, to move the X-Y slider 103 to not be in contact with the X beam 105, the gaps g1 to g4 between the stopper end faces and the I cores fixed to the beam are designed to be smaller than the gaps h1 to h4 between the E cores and I cores. This means that the minimum gap between the X beam 105 and the X-Y slider 103, which surrounds at least part of the X beam 105, is determined not by the gaps between the E cores and I cores, but by the stoppers. Thus, contact between the E cores and I cores can be prevented, to realize smooth movement of the X-Y slider 103.

When the stoppers are set between the X beam 105 and the X-Y slider 103, at at least two positions on each of the two sides of the coil units 108a (108b) and 108c (108d), which are arranged in a row, contact between the E cores and I cores, which occurs when the X-Y slider 103 is inclined in the yaw direction (ωZ direction), can be prevented reliably.

This embodiment also can be applied to between the Y beam 150 and the X-Y slider 103.

Second Embodiment

Figure 3:
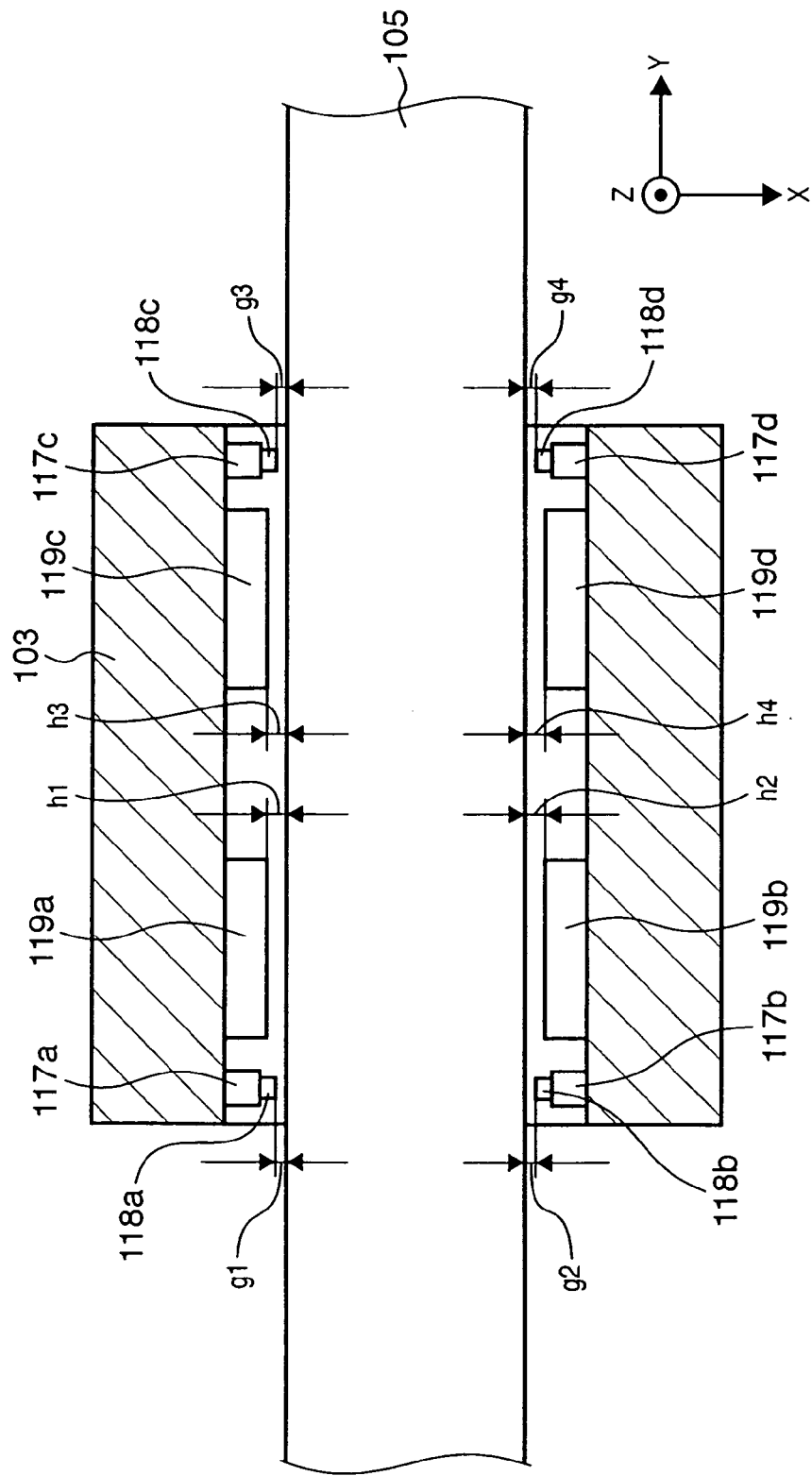
FIG. 3 is a (partially cutaway) plan view showing part of an X beam and an X-Y slider in a wafer stage device or a position apparatus (second embodiment)

In the second embodiment, as an actuator that maintains an X-Y slider 103 and an X beam 105 in a non-contact state, an air pad using a gas pressure is employed. FIG. 3 is a (partially cutaway) plan view showing part of the X beam 105 and X-Y slider 103 in a wafer stage device or positioning apparatus, shown in FIGS. 8 and 9.

Four air pads 119a to 119d, which are made of, e.g., a porous ceramic material, and include air injecting portions, are fixed to the X-Y slider 103. Compressed air is supplied to the air pads 119a to 119d through air supply pipes (not shown). When the air is discharged from the air pad end faces opposing the side surfaces of the X beam 105 through the air injecting portions of the air pads 119a to 119d, the X-Y slider 103 and X beam 105 can be maintained in the non-contact state.

Outside the air pads 119a (119b) and 119c (119d), stoppers 118a to 118d, serving as position regulators, are fixed to the X-Y slider 103 at four portions through pedestals (support members) 117a to 117d. Gaps g1 to g4 between the distal end faces (the surfaces opposing the X beam) of the stoppers 118a to 118d and the side surfaces of the X beam 105 are designed to be smaller than gaps h1 to h4 between the end edges of the air pads and the end faces of the X beam 105.

Typically, the gaps between the air pads 119a to 119d and the X beam 105 are smaller than the gaps between the E cores and I cores that use electromagnetic forces, such as those in the first embodiment. Thus, the gaps between the stoppers 118a to 118d and the X beam 105 should also be defined with higher accuracy. The air pads and stoppers may be machined simultaneously.

As described above, according to the second embodiment, in the positioning apparatus, which utilizes a gas pressure to maintain the X-Y slider 103 in a non-contact state with the X beam 105, the gaps between the stopper end faces and the X beam 105 are designed to be smaller than the gaps between the air injection surfaces and the X beam 105. This prevents contact between the air pads 119a to 119d and the X beam 105, to realize smooth movement of the X-Y slider 103.

When the stoppers are set between the X beam 105 and the X-Y slider 103, at at least two positions on each of the two sides of the air pads 119a (119b) and 119c (119d), which are arranged in a row, contact between the E cores and I cores, which occurs when the X-Y slider 103 is inclined in the yaw direction (ωZ direction), can be prevented reliably.

This embodiment can also be applied to between the Y beam 150 and the X-Y slider 103.

Although the air pads are preferably provided to the X-Y slider 103, as described above, they may be provided to the X beam 105 or the Y beam 150.

Third Embodiment

The third embodiment is directed to an improvement in the structure of the stopper (position regulator) of each of the first and second embodiments. An example in which the stopper of the first embodiment is improved will be described hereinafter. The stopper of the second embodiment can also be improved in the same manner.

Figure 4:
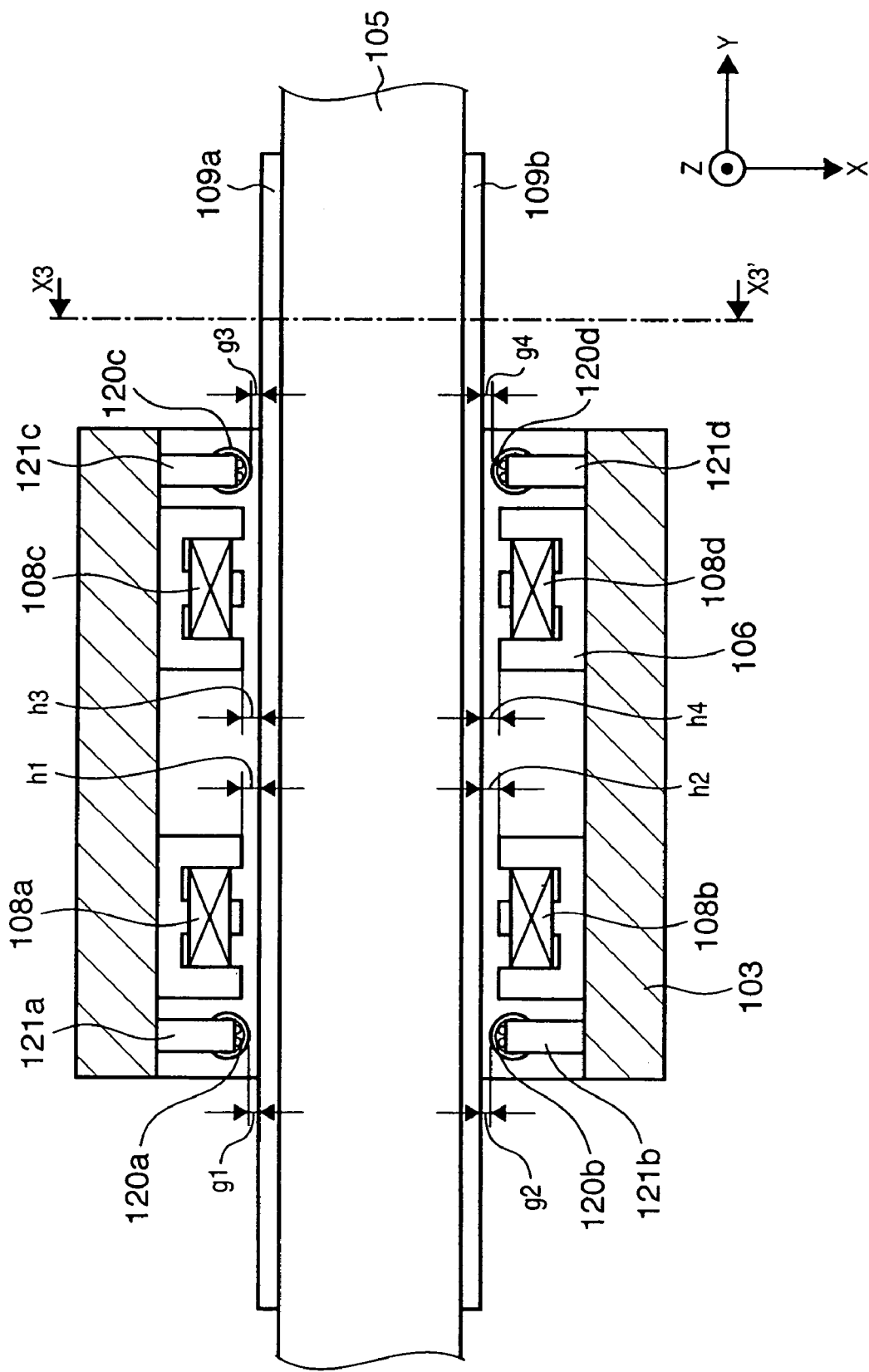
FIG. 4 is a (partially cutaway) plan view showing part of an X beam and an X-Y slider in a wafer stage device or a positioning apparatus (third embodiment)
Figure 5:
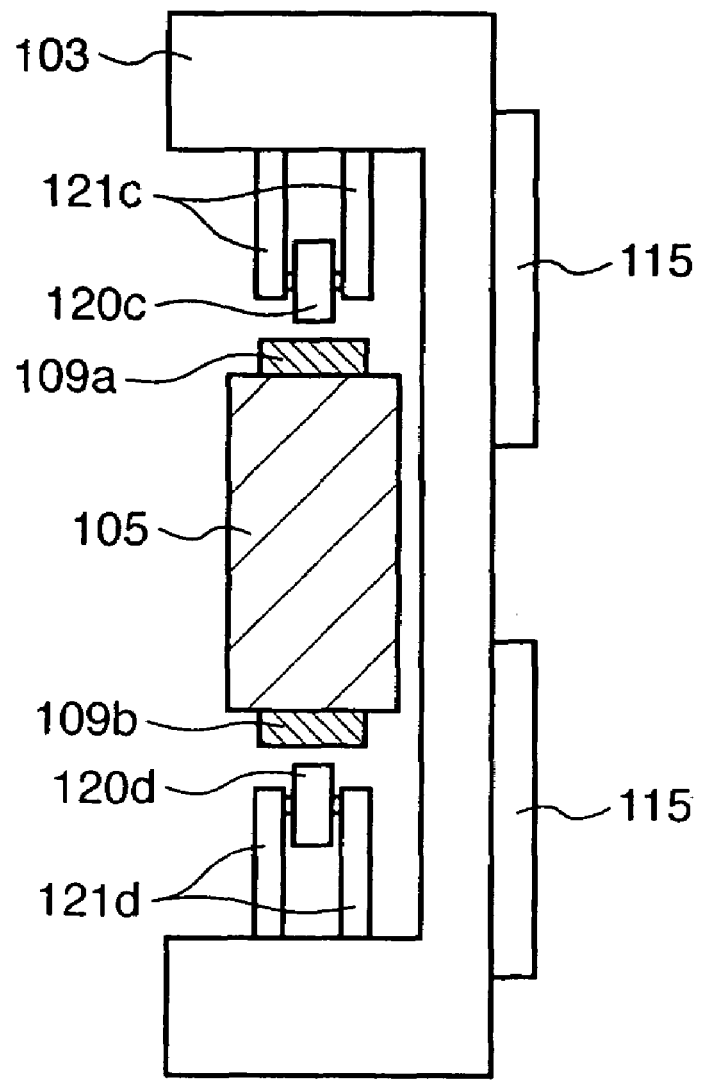
FIG. 5 is a sectional view taken along the line X3-X3' of FIG. 4 and seen leftward.

FIG. 4 is a (partially cutaway) plan view showing part of the X beam 105 and X-Y slider 103 in the wafer stage device or positioning apparatus, shown in FIGS. 8 and 9. FIG. 5 is a sectional view taken along the line X3-X3' of FIG. 4 and seen leftward.

The embodiment shown in FIGS. 4 and 5 is different from the first embodiment (FIGS. 1 and 2) in that, instead of the stoppers 118a to 118d not having rotary members, four bearings 120a to 120d, including rotary members (outer rings) are fixed to the X-Y slider 103. The inner rings of the bearings 120a to 120d are fixed to the X-Y slider 103 through support members 121a to 121d and serve as stoppers, so that their outer rings can rotate about shafts parallel to the Z axis. Gaps g1 to g4 between the bearings 120a to 120d and I cores 109a to 109b are designed to be smaller than gaps h1 to h4 between the E cores and I cores. Thus, when the gaps between the X beam 105 and the E cores on the X-Y slider 103 decrease, or the X-Y slider 103 is inclined in a yaw direction (ωZ direction) with respect to the beam 105, the bearings come into contact with the I cores before the E cores of the coil units come into the I cores. Thus, the E cores can be prevented from being damaged or worn.

The four bearings 120a to 120d, including the rotary members (outer rings), form the stoppers. Regarding the X beam 105, when the X-Y slider 103 is to be moved in the Y direction, even if the outer ring of a bearing comes into contact with the X beam 105, the sliding resistance is small, and the damage to the X beam 105 itself can be minimized. In each bearing, a gap is present among the rolling member, such as a ball, the inner ring, and the outer ring, to produce play. The gaps g1 to g4 can be assumed to include the play amounts.

The I core can be typically made of a soft material, such as silicon steel. To further decrease the damage to the I core, preferably, the outer surface of the outer ring of the bearing may be fitted with a soft-material ring, e.g., a resin ring, coated with a resin, or wound by a tape, or the like, as a buffer member. Alternatively, it is also effective to plate the I core with a rigid material or to heat-treat the I core to increase its surface hardness, thus increasing the wear resistance.

The third embodiment can also be applied to between the Y beam 150 and the X-Y slider 103.

Fourth Embodiment

The fourth embodiment provides an improvement over the third embodiment.

Figure 6:
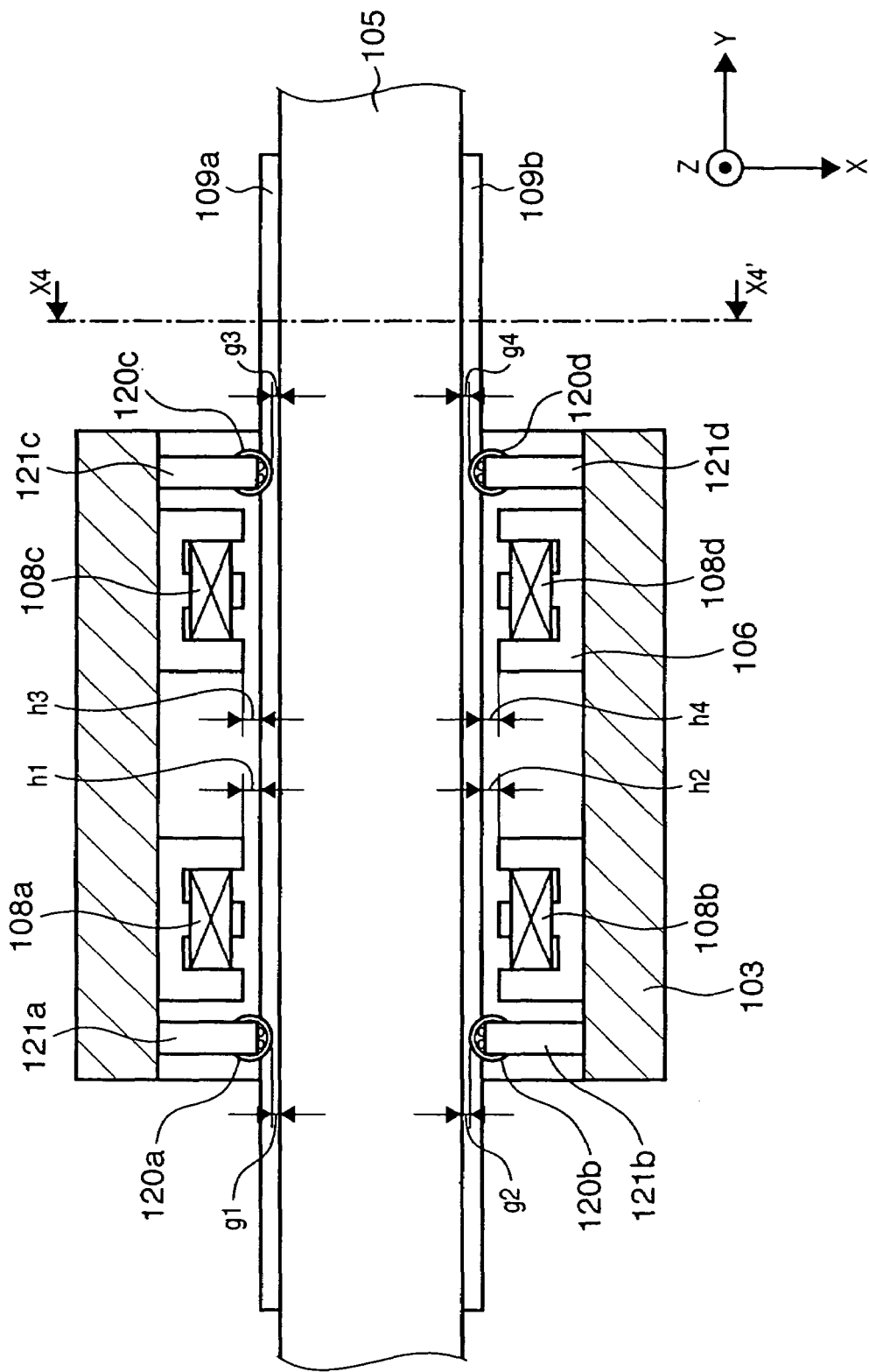
FIG. 6 is a (partially cutaway) plan view showing part of an X beam and an X-Y slider in a wafer stage device or a position apparatus (fourth embodiment)

FIG. 6 is a (partially cutaway) plan view showing part of the X beam 105 and X-Y slider 103 in the wafer stage device or positioning apparatus shown in FIGS. 8 and 9. FIG. 7 is a sectional view taken along the line X4-X4' of FIG. 6 and seen leftward.

The fourth embodiment is different from the third embodiment in the following respects. Of the structure of the X beam 105, those portions which the outer rings of bearings 120a to 120d come into contact with are shifted from I cores, which can generally be made of a soft material, such that the outer rings come into contact with the end faces of the X beam 105. This not only prevents contact of the E cores and I cores, but also, prevents damage, wear, and the like, to the I core caused by the contact with the bearings 120a to 120d, to realize smooth movement of the X-Y slider 103.

The fourth embodiment can also be applied to between the Y beam 150 and the X-Y slider 103.

Also, in the first embodiment, of the structure of the X beam 105, those portions with which the stoppers come into contact can be shifted from the I cores, such that the stoppers come into contact with the end faces of the X beam 105.

[Application]

Figure 13:
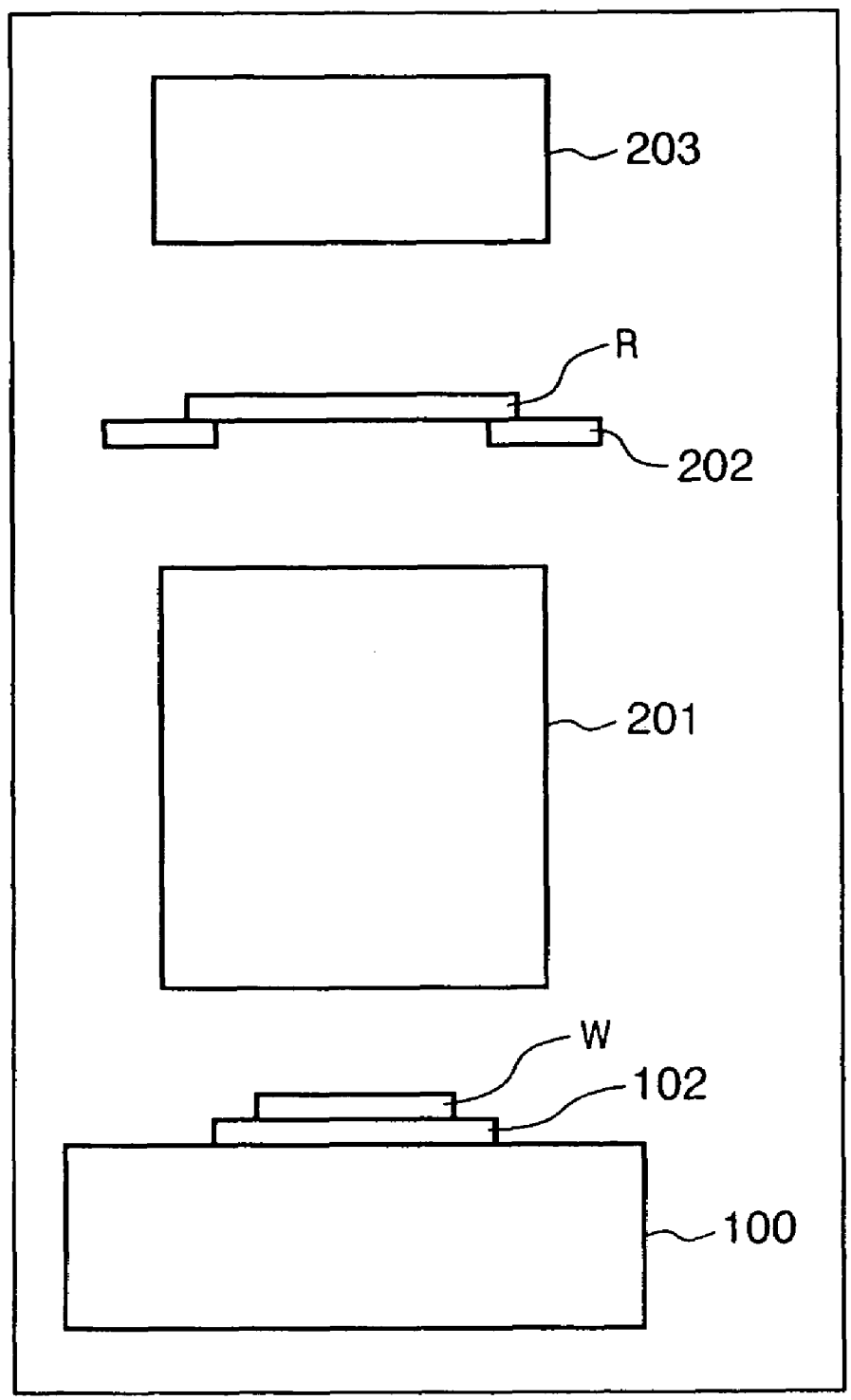
FIG. 13 is a view showing the schematic structure of an exposure apparatus having a built-in positioning apparatus or a wafer stage device of the present invention, represented by the first to fourth embodiments.

FIG. 13 is a view showing the schematic structure of an exposure apparatus having a built-in positioning apparatus or a wafer stage device of the present invention, represented by the first to fourth embodiments. The exposure apparatus schematically shown in FIG. 13 illuminates an original R held by an original stage 102, by an illumination optical system 203, and projects and transfers a pattern formed on the original R onto a wafer (substrate) held by a wafer stage device 100 by an optical system 201. The exposure apparatus may be formed as a stepper or scanner, or may be formed with another scheme. Also, the exposure apparatus can be formed as an apparatus that transfers a pattern onto a substrate by using light, such as ultraviolet light, a laser beam, or X-rays, or can draw a pattern on the original with a charged particle beam, such as an electron beam. In the latter case, the illumination optical system 203 can be replaced by a structure, including a charged particle beam source.

FIG. 14 is a flowchart showing a semiconductor device manufacturing process using the exposure apparatus described above. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the exposure apparatus described above in accordance with lithography, using the mask and wafer described above. In step 5 (assembly), called a post-process, a semiconductor chip is formed from the wafer fabricated in step 4. This step includes processes, such as assembly (dicing and bonding) and packaging (chip encapsulation). In step 6 (inspection), inspections, such as an operation check test and a durability test, of the semiconductor device fabricated in step 5, are performed. A semiconductor device is finished with these steps and shipped in step 7.

Figure 15:
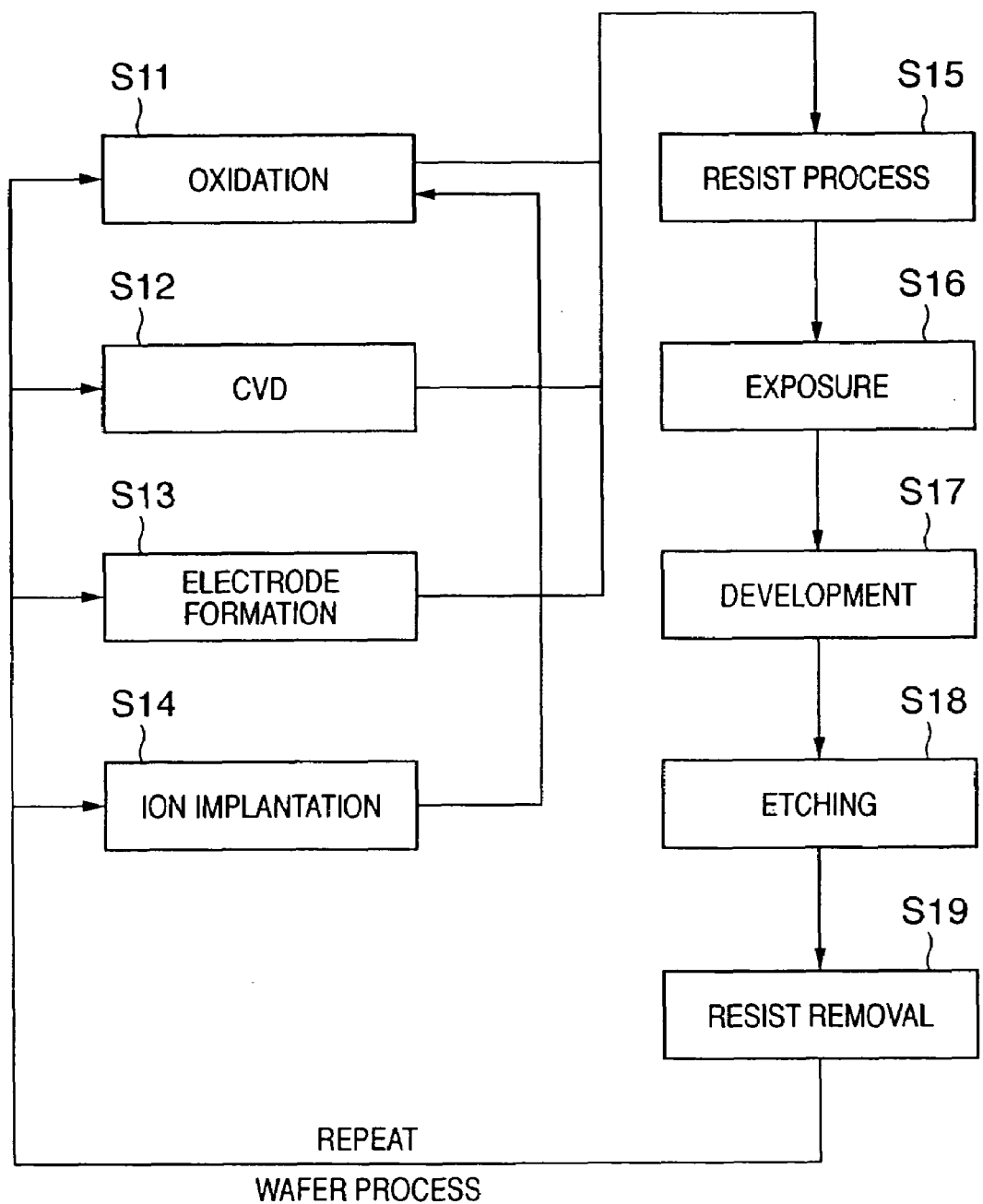
FIG. 15 is a flowchart showing a preprocess in the semiconductor device manufacturing process using the exposure apparatus having the built-in positioning apparatus or wafer stage device of the present invention, represented by the first to fourth embodiments.

The wafer process of step 4 has the following steps (FIG. 15), i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

As many apparently widely different embodiments of the present invention can be made without departing from the spirit and scope thereof, it is to be understood that the invention is not limited to the specific embodiments thereof, except as defined in the claims.

What is claimed is:

1. A positioning apparatus comprising:
   a beam which is driven in a first direction that is perpendicular to a longitudinal direction of the beam;
   a movable member which surrounds at least a part of the beam and moves with the beam moving in the first direction;
   an actuator, which generates a force in the first direction between the beam and the movable member, to control a positional relationship in the first direction between the beam and the movable member; and
   a position regulator, including a bearing that is arranged between the beam and the movable member, and configured to regulate a positional relationship in the first direction between the beam and the movable member,
   wherein the movable member is further driven along the longitudinal direction of the beam, and the bearing has an outer ring, which can rotate about an axis perpendicular to a plane that is parallel to the first direction and the longitudinal direction.

2. The apparatus according to claim 1, wherein the position regulator determines a minimum gap between the beam and the movable member.

3. The apparatus according to claim 1, wherein
   the actuator includes a first element fixed to the beam and a second element fixed to the movable member, and
   the position regulator is arranged so that the first and second elements do not come into contact with each other.

4. The apparatus according to claim 1, wherein
   the actuator includes an element fixed to the beam, and
   the position regulator is arranged so that the element and the movable member do not come into contact with each other.

5. The apparatus according to claim 1, wherein
   the actuator includes an element fixed to the movable member, and
   the position regulator is arranged so that the element and the beam do not come into contact with each other.

6. A positioning apparatus comprising:
   a beam which is driven in a first direction that is perpendicular to a longitudinal direction of the beam;
   a movable member which surrounds at least a part of the beam and moves with the beam moving in the first direction;
   an actuator, which generates a force in the first direction between the beam and the movable member, to control a positional relationship in the first direction between the beam and the movable member; and
   a position regulator, including a bearing that is arranged between the beam and the movable member, and configured to regulate the positional relationship in the first direction between the beam and the movable member,
   wherein the bearing is configured such that an impact to be applied to the bearing is buffered by decreasing a gap between the beam and the movable member.

7. The apparatus according to claim 6, wherein
   the actuator includes a first element fixed to the beam and a second element fixed to the movable member, and
   the position regulator is arranged so that the first and second elements do not come into contact with each other.

8. The apparatus according to claim 6, wherein
   the actuator includes an element fixed to the beam, and
   the position regulator is arranged so that the element and the movable member do not come into contact with each other.

9. The apparatus according to claim 6, wherein
   the actuator includes an element fixed to the movable member, and
   the position regulator is arranged so that the element and the beam do not come into contact with each other.

10. The apparatus according to claim 6, wherein
    the actuator includes an element fixed to the movable member, and
    the position regulator is arranged so that the element and the beam do not come into contact with each other.

11. The apparatus according to claim 6, wherein the bearing has a buffer member around an outer ring.

12. A positioning apparatus comprising:
    a beam which is driven in a first direction that is perpendicular to a longitudinal direction of the beam;
    a movable member which surrounds at least a part of the beam and moves with the beam moving in the first direction;
    an actuator, which generates a force in the first direction between the beam and the movable member, to control a positional relationship in the first direction between the beam and the movable member; and
    a position regulator arranged between the beam and the movable member and configured to regulate the positional relationship in the first direction between the beam and the movable member,
    wherein the position regulator comes into contact with the beam or the movable member, when a gap between the beam and the movable member reaches a predetermined value, to regulate the positional relationship between the beam and the movable member such that the gap between the beam and the movable member is maintained to be at least the predetermined value.

13. The apparatus according to claim 12, wherein
    the actuator includes a first element fixed to the beam and a second element fixed to the movable member, and
    the position regulator is arranged so that the first and second elements do not come into contact with each other.

14. The apparatus according to claim 12, wherein
    the actuator includes an element fixed to the beam, and
    the position regulator is arranged so that the element and the movable member do not come into contact with each other.

15. The apparatus according to claim 12, wherein
    the actuator includes an element fixed to the movable member, and
    the position regulator is arranged so that the element and the beam do not come into contact with each other.

16. The apparatus according to claim 12, wherein
    the actuator includes an element fixed to the movable member, and
    the position regulator is arranged so that the element and the beam do not come into contact with each other.